(12) United States Patent
Takada et al.

(10) Patent No.: US 10,147,621 B2
(45) Date of Patent: Dec. 4, 2018

(54) ADHESIVE TAPE SEPARATING TOOL, MANUFACTURING APPARATUS OF SEMICONDUCTOR CHIP, MANUFACTURING APPARATUS OF MEMS DEVICE MANUFACTURING APPARATUS OF LIQUID EJECTING HEAD, AND SEPARATING METHOD OF ADHESIVE TAPE

(71) Applicant: SEIKO EPSON CORPORATION, Tokyo (JP)

(72) Inventors: Akira Takada, Matsumoto (JP); Kazuyuki Harayama, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/700,982

(22) Filed: Sep. 11, 2017

(65) Prior Publication Data

US 2018/0090351 A1 Mar. 29, 2018

(30) Foreign Application Priority Data

Sep. 26, 2016 (JP) ................................ 2016-186715

(51) Int. Cl.
*H01L 21/78* (2006.01)
*H01L 21/683* (2006.01)
(Continued)

(52) U.S. Cl.
CPC ...... *H01L 21/67132* (2013.01); *B32B 43/006* (2013.01); *B41J 2/161* (2013.01); *B41J 2/1607* (2013.01); *B41J 2/1623* (2013.01); *B41J 2/1632* (2013.01); *B41J 2/1635* (2013.01); *B81C 99/0025* (2013.01); *H01L 21/6838* (2013.01); *H01L 21/6875* (2013.01); *B32B 2405/00* (2013.01); *B32B 2457/14* (2013.01);
(Continued)

(58) Field of Classification Search
CPC ......... Y10T 156/1132; Y10T 156/1944; Y10S 156/93; Y10S 156/941; B32B 43/006; B32B 38/10; C09J 2205/302; B81C 99/0025; H01L 2224/80052; H01L 2224/98; H01L 2221/68318; H01L 2221/68386
See application file for complete search history.

(56) References Cited

U.S. PATENT DOCUMENTS 6,106,222 A * 8/2000 Tsuji ................. H01L 21/67132
225/2
6,505,395 B1 * 1/2003 Farnworth ............ B25B 11/005
156/750

(Continued)

FOREIGN PATENT DOCUMENTS

JP 06-318636 11/1994
JP 2013-004697 1/2013

*Primary Examiner* — Mark A Osele
(74) *Attorney, Agent, or Firm* — Workman Nydegger

(57) ABSTRACT

Provided is an adhesive tape separating tool which separates adhesive tape bonded to one face of a work which includes an opening on the one face from the work, in which a protrusion portion forming region in which a plurality of protrusion portions are formed is provided on a face on a side which comes into contact with the work in the tape separating tool, and the protrusion portion forming region is disposed at a position separated from a position facing the opening on the one face of the work.

8 Claims, 9 Drawing Sheets

(51) Int. Cl.
  *B32B 43/00*    (2006.01)
  *H01L 21/67*    (2006.01)
  *B41J 2/16*     (2006.01)
  *B81C 99/00*    (2010.01)
  *H01L 21/687*   (2006.01)

(52) U.S. Cl.
  CPC ............... *H01L 2221/68318* (2013.01); *H01L 2221/68386* (2013.01)

(56) References Cited

U.S. PATENT DOCUMENTS

| | | | | |
|---|---|---|---|---|
| 6,930,387 | B2* | 8/2005 | Carr | B81C 1/00888 |
| | | | | 257/678 |
| 8,182,649 | B2* | 5/2012 | Watanabe | H01L 21/67132 |
| | | | | 156/707 |
| 8,465,011 | B2* | 6/2013 | Segawa | H01L 21/67132 |
| | | | | 156/707 |
| 9,711,383 | B2* | 7/2017 | Tanaka | H01L 21/67132 |
| 2010/0289283 | A1* | 11/2010 | Watanabe | H01L 21/67132 |
| | | | | 294/183 |

* cited by examiner

ADHESIVE TAPE SEPARATING TOOL, MANUFACTURING APPARATUS OF SEMICONDUCTOR CHIP, MANUFACTURING APPARATUS OF MEMS DEVICE MANUFACTURING APPARATUS OF LIQUID EJECTING HEAD, AND SEPARATING METHOD OF ADHESIVE TAPE

BACKGROUND

1. Technical Field

The present invention relates to an adhesive tape separating tool, a manufacturing apparatus of a semiconductor chip, a manufacturing apparatus of a MEMS device, a manufacturing apparatus of a liquid ejecting head, and a separating method of adhesive tape in which the adhesive tape which is used when dividing a silicon substrate which configures, for example, a semiconductor chip, a MEMS device, or the like, into a plurality of parts is separated from each part (work).

2. Related Art

The micro electro mechanical system (MEMS) device includes a driving element such as a piezoelectric element on a silicon substrate, and is applied to various liquid ejecting apparatuses and display devices, or a vibrating sensor, and the like. For example, in the liquid ejecting apparatus, various liquids are ejected from a liquid ejecting head as a form of the MEMS device. As the liquid ejecting apparatus, for example, there is an image recording apparatus such as an ink jet printer or an ink jet plotter, and in recent years, the liquid ejecting apparatus has also been applied to various manufacturing apparatuses by bringing the best of characteristics in which liquid of a very small amount could be accurately landed on a predetermined position. For example, the liquid ejecting apparatus is applied to a display manufacturing apparatus which manufactures a color filter of a liquid crystal display, and the like, an electrode forming device which forms an electrode of an organic electro luminescence (EL) display, a surface emission display (FED), and the like, and a chip manufacturing apparatus which manufactures a biochip (biochemical element). Liquid ink is ejected in a recording head for the image recording apparatus, and a solution of each coloring material of red (R), green (G), and blue (B) is ejected in a coloring material ejecting head for the display manufacturing apparatus. In addition, a liquid electrode material is ejected in an electrode material ejecting head for the electrode forming device, and a solution of a bioorganic material is ejected in a bioorganic material ejecting head for the chip manufacturing apparatus.

In such a liquid ejecting head, there is an ejecting head which includes a stacked body in which a plurality of substrates are bonded in a stacked state. In the stacked body, a liquid flow path which communicates with a nozzle, a movable region for causing a pressure change in liquid in the liquid flow path, and causing the liquid to be ejected from the nozzle, and the like, are provided. For example, a silicon single crystalline substrate (hereinafter, simply referred to as silicon wafer or silicon substrate) is used as the above described substrate, a flow path, or the like, is formed in the silicon substrate, and the silicon substrate is divided into a chip size which is necessary, thereafter.

As a method of dividing the silicon substrate into a plurality of chips which are used in the MEMS device, or a semiconductor device other than that, a method has been known, in which a groove with a depth which does not penetrate the substrate, a plurality of small through-holes, and the like, are formed as a predetermined line for cutting which becomes a trigger of a division on the silicon substrate, adhesive tape with elasticity such as dicing tape is bonded to one face of the silicon substrate, and the silicon substrate is divided, using the above described predetermined line for cutting, when expanding the adhesive tape. In addition, as a method separating the adhesive tape from each of the divided chips, and picking up each of the chips, a method of separating the adhesive tape from each chip, by supporting each chip from one face side of the substrate on which the adhesive tape is bonded, in a state in which a contact area is set to be as small as possible, using a protrusion portion formed in a pin holder (needle) shape, and suctioning and depressurizing a space on the protrusion portion side rather than the adhesive tape in this state has been proposed (for example, refer to JP-A-2013-004697).

FIGS. 11 to 13 are process drawings (enlarged views) for describing a process of separating adhesive tape from a chip (work) in the related art. As illustrated in FIG. 11, when a protrusion portion 58 side is suctioned and depressurized by setting adhesive tape 56 to a boundary, in a state in which the protrusion portion comes into contact with a position of an opening, in a case in which a recessed portion such as a flow path, or an opening of a through-hole 57 is formed on a face onto which the adhesive tape 56 of a work 55 is bonded, an apex portion of the protrusion portion 58 and the work 55 are pressurized in a direction of getting closer to each other in a state of interposing the adhesive tape 56 therebetween, due to a difference in pressure. Due to this, an adhesive layer 59 of the adhesive tape 56 is pushed into the above described opening (refer to arrow in figure). As illustrated in FIG. 12, the adhesive layer 59 pushed into the opening is also pulled back when the adhesive tape 56 is pulled downward at a time in which the adhesive tape 56 at a portion other than the portion at which the apex portion of the protrusion portion 58 comes into contact with the work 55 is separated from an abutting face of the work 55 due to a suctioning force; however, as illustrated in FIG. 13, there has been a problem in that a part (remains of adhesive member 60) of the adhesive layer 59 remains in the opening. When the adhesive member remains in the opening like this, the chip is determined to be defective goods, and it causes a decrease in yield.

SUMMARY

An advantage of some aspects of the invention is to provide an adhesive tape separating tool, a manufacturing apparatus of a semiconductor chip, a manufacturing apparatus of a MEMS device, a manufacturing apparatus of a liquid ejecting head, and a separating method of adhesive tape, in which it is possible to separate the adhesive tape without having an adhesive member remaining in an opening of a work.

According to an aspect of the invention, there is provided an adhesive tape separating tool which separates adhesive tape bonded to one face of a work which includes an opening on the one face, in which a protrusion portion forming region in which a plurality of protrusion portions are formed is provided on a face on a side which comes into contact with the work in the tape separating tool, and the protrusion portion forming region is disposed at a position separated from a position facing the opening on the one face of the work.

According to this aspect, the protrusion portion does not come into contact with the opening of the work, even in a case in which the protrusion portion of the adhesive tape separating tool comes into contact with the work when separating the adhesive tape from the work. In this manner, a part of adhesive member of the adhesive tape is prevented from entering and remaining in the opening of the work. As a result, it is possible to improve a yield.

In the above described configuration, it is preferable to adopt a configuration in which an opening group in which a plurality of the openings are aligned in a first direction is formed on one face of the work, and the adhesive tape separating tool includes a protrusion portion at each of positions corresponding to both sides in the first direction of the opening group.

According to the configuration, since the protrusion portions are formed at the positions corresponding to both sides in the aligning direction of the opening group in the tape separating tool, it is possible to prevent a posture of the work from being unstable. In this manner, it is possible to smoothly lift up (pick up) the work from the adhesive tape using a jig, or the like, for example.

According to another aspect of the invention, there is provided a manufacturing apparatus of a semiconductor chip in which adhesive tape bonded to one face of a semiconductor chip, as a work including an opening on one face is separated from the semiconductor chip, the apparatus including the adhesive tape separating tool according to any one of the aspects.

According to this aspect, since it is possible to prevent a part of adhesive member of the adhesive tape from entering and remaining in an opening of the semiconductor chip, it is possible to suppress an occurrence of a failure in electrical connection which is caused by remaining of the adhesive member in a portion in which an electrode or wiring of a substrate is formed, for example.

According to still another aspect of the invention, there is provided a manufacturing apparatus of a MEMS device in which adhesive tape bonded to one face in one substrate included in the MEMS device, on which an opening is formed is separated from the substrate, the apparatus including the adhesive tape separating tool according to any one of the aspects.

According to this aspect, since it is possible to prevent a part of adhesive member of the adhesive tape from entering and remaining in an opening of a work, it is possible to suppress an occurrence of a failure in electrical connection which is caused by remaining of the adhesive member in a portion in which an electrode or wiring of a substrate is formed, for example.

According to still another aspect of the invention, there is provided a manufacturing apparatus of a liquid ejecting head in which adhesive tape bonded to one face in one substrate included in the liquid ejecting head, on which an opening is formed is separated from the substrate, the apparatus including the adhesive tape separating tool according to any one of the aspects.

According to this aspect, since it is possible to prevent a part of adhesive member of the adhesive tape from entering and remaining in the opening of a work, it is possible to suppress an occurrence of a failure in which flowing of liquid is hindered, bubbles remain, or the like, due to remaining of an adhesive member at a portion in which a flow path, or the like, of a substrate is formed, for example.

According to still another aspect of the invention, there is provided an adhesive tape separating method in which adhesive tape bonded to one face of a work including an opening on the one face is separated from the work, using an adhesive tape separating tool in which a plurality of protrusion portions are formed, the method including causing the adhesive tape separating tool and the work to face each other by interposing the adhesive tape therebetween, in a state in which the adhesive tape separating tool and the work are positioned; and pressurizing the adhesive tape separating tool and the work in a direction of getting closer to each other by interposing the adhesive tape therebetween, in which, in the pressurizing, the protrusion portion is caused to come into contact with a position on one face of the work which is separated from the opening, by interposing the adhesive tape therebetween.

According to this aspect, the protrusion portion does not come into contact with the opening of the work, even in a case in which the protrusion portion of the adhesive tape separating tool comes into contact with the work when separating the adhesive tape from the work. Due to this, it is possible to prevent a part of adhesive member of the adhesive tape from entering and remaining in the opening of the work. As a result, it is possible to improve a yield.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment for executing the invention will be described with reference to accompanying drawings. In the embodiment which will be described below, various limitations are performed as specific examples which are preferable for the invention; however, the scope of the invention is not limited to these forms as long as there is no description for limiting the invention, particularly, in the following descriptions. In addition, in the embodiment, a MEMS device which includes a stacked body configured of a plurality of substrates which are stacked, or a recording head (ink jet head) 2 as one form of a semiconductor device will be described as an example. In the recording head 2, for example, a driving element which drives a movable region by receiving an electric signal from the outside corresponds to a piezoelectric element 19 (refer to FIG. 3) of the recording head 2, and a space for allowing driving of the movable region corresponds to a pressure chamber 15 (refer to FIG. 3) of the recording head 2. In addition, the invention can also be applied to a configuration in which the driving element converts a change in pressure in the space into an electric signal, and the signal is output to the outside of the MEMS device.

Figure 1:
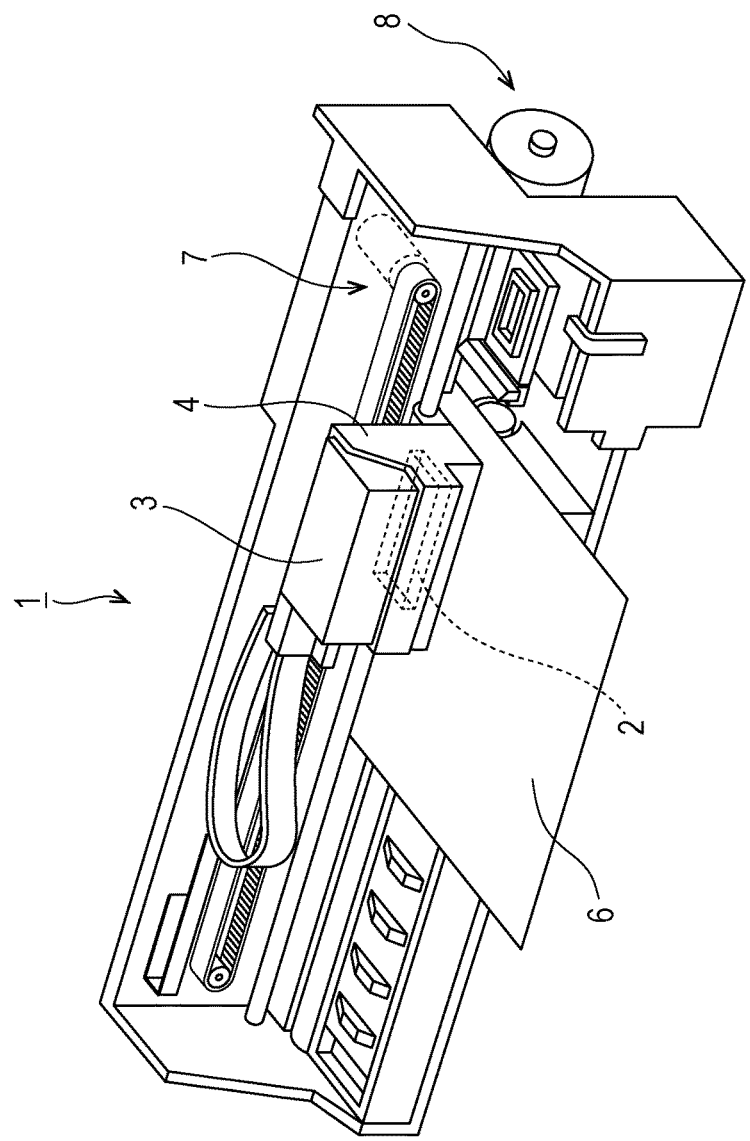
FIG. 1 is a perspective view which describes a configuration of a liquid ejecting apparatus (printer).

FIG. 1 is a perspective view which illustrates a configuration of a printer 1. The printer 1 is mounted with the recording head 2, and is provided with a carriage 4 in which an ink cartridge 3 (liquid supply source) is detachably attached, a carriage moving mechanism 7 which causes the carriage 4 to reciprocate in a paper width direction, that is, a main scanning direction of a recording sheet 6 (recording medium, and a type of landing target), a sheet feeding mechanism 8 which transports the recording sheet 6 in a sub-scanning direction which intersects (orthogonal in embodiment) the main scanning direction, and the like. The printer 1 records characters, an image, or the like, on the recording sheet 6 while causing the carriage 4 to reciprocate, while sequentially transporting the recording sheet 6. In addition, it is possible to also adopt a configuration in which the ink cartridges 3 is disposed on a main body side of the printer 1, not the carriage 4, and ink in the ink cartridges 3 is supplied to the recording head 2 side through an ink supply tube.

Figure 2:
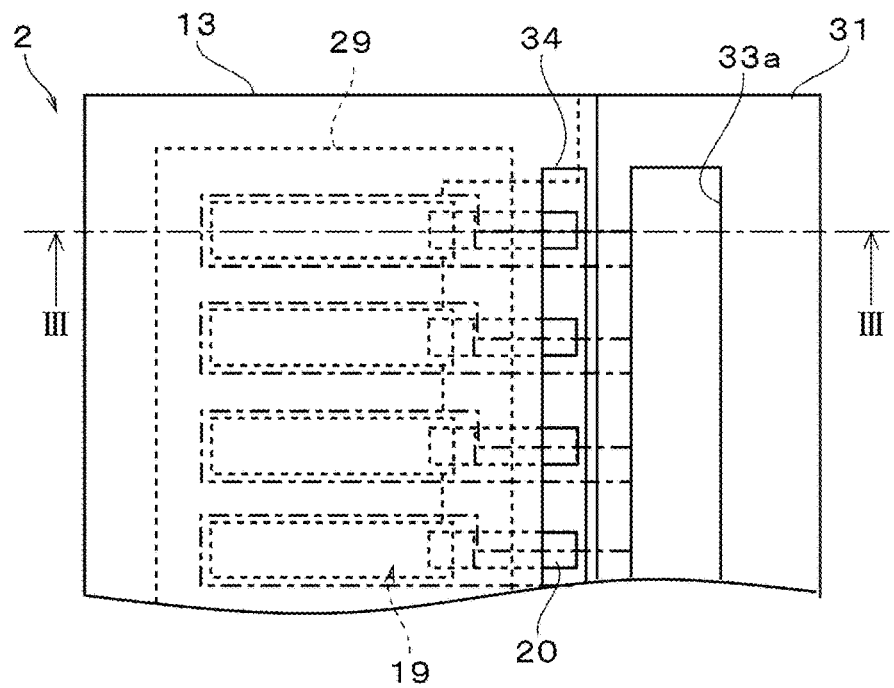
FIG. 2 is a plan view which describes a configuration of a liquid ejecting head (recording head).
Figure 3:
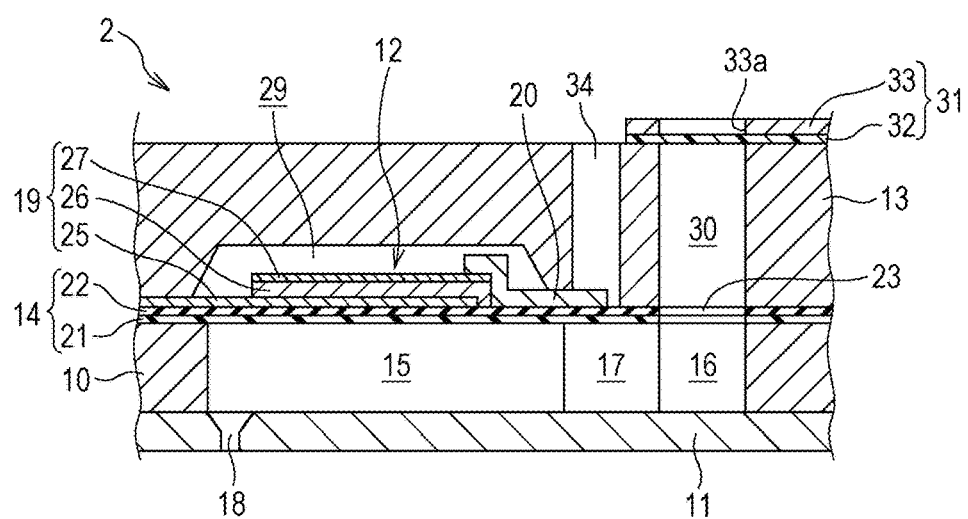
FIG. 3 is a sectional view taken along line III-III in FIG. 2.

FIG. 2 is a plan view of the recording head 2 in the embodiment, and FIG. 3 is a sectional view of main portions of the recording head 2 taken along line III-III in FIG. 2. The recording head 2 in the embodiment is configured by stacking a flow path forming substrate 10, a nozzle plate 11, an actuator unit 12, a sealing plate 13, and the like. The flow path forming substrate 10 is manufactured of, for example, a silicon single crystalline substrate (hereinafter, referred to as silicon substrate) of which a plane orientation on a face (bonding face) to which the nozzle plate 11 or the sealing plate 13 is bonded is (110). The silicon substrate and a silicon substrate 9 of the nozzle plate 11 which will be described later are divided into parts for the individual recording head 2 using a device for dividing and picking up a work 39 in a state of being stacked on top of each other. This point will be described later. Hollow portions which partition the pressure chamber 15 are formed by being aligned in a nozzle column direction using anisotropic etching, in the flow path forming substrate 10. The pressure chamber 15 is a space which is formed when an opening on one side of the hollow portion of the flow path forming substrate 10 is blocked by the nozzle plate 11, and similarly, an opening of the hollow portion on the other side is blocked by a vibrating plate 14. The hollow portion of the pressure chamber 15 in the embodiment includes an approximately parallelogram-shaped opening which is long in a direction orthogonal to the nozzle column direction.

A reservoir 16 which is common to each of the pressure chambers 15 is formed in a region isolated on the other side (a side opposite to the side which communicates with nozzle 18) of the pressure chamber 15 of the flow path forming substrate 10 in a longitudinal direction, along the nozzle column direction. The reservoir 16 and the pressure chamber 15 are caused to communicate with each other through the individual supply port 17 which is provided in each pressure chamber 15. The reservoir 16 is provided for each type of ink (each color), and ink which is common is stored in the plurality of pressure chambers 15. The individual supply port 17 is formed in a width smaller than that of the pressure chamber 15, and applies a flow path resistance to ink which flows into the pressure chamber 15 from the reservoir 16.

Figure 4:
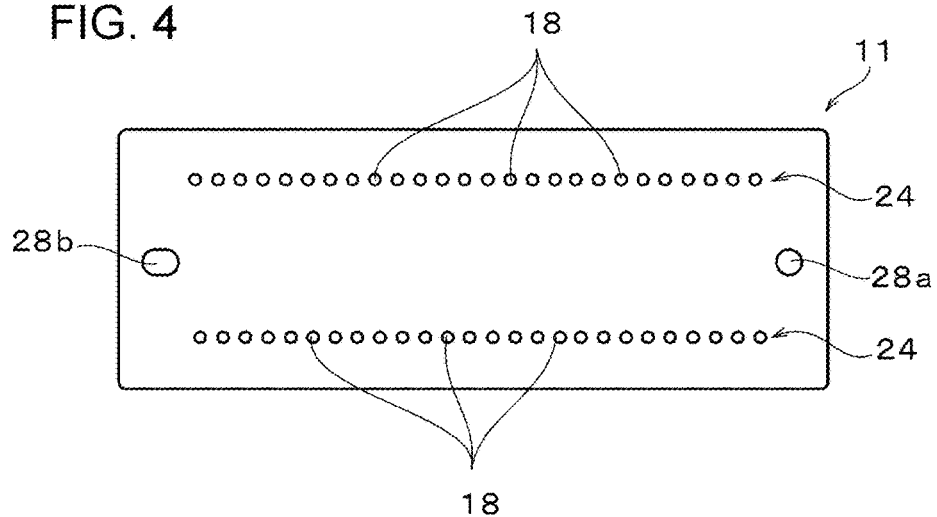
FIG. 4 is a plan view of a nozzle plate.
Figure 5:
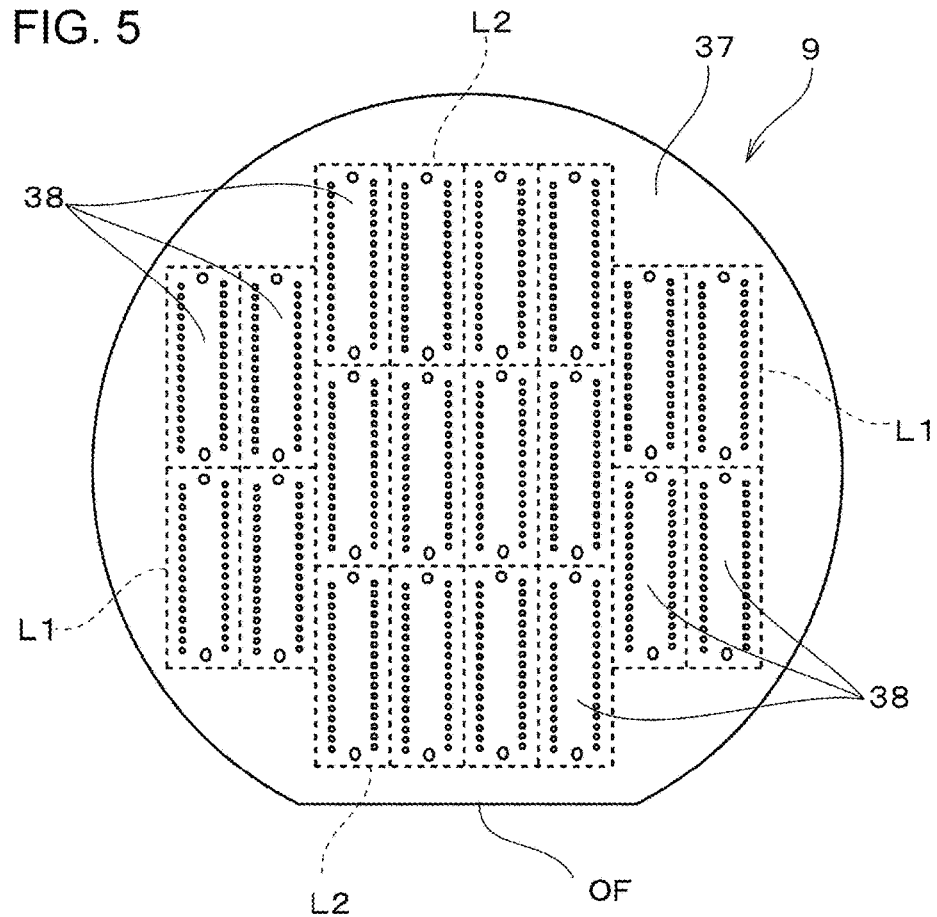
FIG. 5 is a plan view of a silicon substrate.

FIG. 4 is a plan view which describes a configuration of the nozzle plate 11. FIG. 5 is a plan view which describes a configuration of a silicon substrate 9 as a base material of the nozzle plate 11. The nozzle plate 11 is bonded to a lower face (a face on the side opposite to vibrating plate 14 side) of the flow path forming substrate 10 through an adhesive, a heat welding film, or the like. The nozzle plate 11 is a plate member on which a plurality of nozzles 18 are opened at a predetermined pitch in a column shape, and is manufactured by dividing the silicon substrate 9 which is illustrated in FIG. 5. Openings of the nozzles 18 which are formed on one face (a face on the side which faces recording sheet 6 in the recording operation) of the nozzle plate 11 are a type of opening in the invention. According to the embodiment, a nozzle column 24 (a type of opening group in the invention) in which the plurality of nozzles 18 are provided along a long (long side) direction of the nozzle plate 11 at a predetermined pitch (for example, 360 [dpi]) is configured. The nozzle columns 24 of two groups in total are formed in the nozzle plate 11 in the embodiment, by being closer to long sides of the nozzle plate 11.

Reference holes 28 for defining a relative position with the flow path forming substrate 10, or the sealing plate 13 are opened at two portions in the nozzle plate 11 in the embodiment. Specifically, a first reference hole 28a which is disposed at a position isolated on one side (right side in figure) of the nozzle plate 11 in the longitudinal direction compared to a region in which the nozzle column 24 is formed in FIG. 4, and a second reference hole 28b which is disposed at a position isolated on the other side (left side in figure) of the nozzle plate 11 in the longitudinal direction compared to the region in which the nozzle column 24 is formed are formed. In addition, the second reference hole 28b between the reference hole 28a and the reference hole 28b is set to a long hole which is long in an aligning direction of the reference holes 28a and 28b. In this manner, a gap is formed between the reference hole and a positioning pin (not illustrated) which is inserted when performing positioning, and it is possible to absorb an error between an interval of the positioning pin in a range of the gap and an interval between the reference holes 28a and 28b. Openings of the reference holes 28a and 28b formed on one face of the nozzle plate 11 are also a type of the opening in the invention. Hereinafter, the reference holes 28a and 28b are not distinguished from each other, and are simply referred to as a reference hole 28.

As illustrated in FIG. 5, the silicon substrate 9 as a base material of the nozzle plate 11 is a silicon single crystalline substrate, and an orientation flat OF which denotes a predetermined plane orientation is formed at a part of the outer periphery thereof. On the surface 37 of the silicon substrate 9, a substrate region 38 which becomes the nozzle plate 11 is partitioned into a plurality of regions using a predetermined line for cutting L1 in a longitudinal direction orthogonal to the orientation flat OF, and a predetermined line for cutting L2 in a horizontal direction which is parallel to the orientation flat OF, and the nozzle 18 (nozzle column 24) or the reference hole 28 is formed in advance in each of the substrate regions 38. The predetermined lines for cutting L1 and L2 are weak portions as a trigger for cutting or dividing the silicon substrate 9 such as a plurality of recessed portions or through-holes which are formed along the outer edge of the substrate region 38, or grooves which are formed in series along the outer edge of the substrate region 38. Dividing of the silicon substrate 9, or the like, will be described later in detail.

The actuator unit 12 in the embodiment is configured of the vibrating plate 14, a piezoelectric element 19, and a lead electrode 20. The vibrating plate 14 is formed of an elastic film 21 formed on a top face of the flow path forming substrate 10, and an insulating film 22 formed on the elastic film 21. The elastic film 21 is formed of silicon dioxide ($SiO_2$), for example, and the insulating film 22 is formed of zirconium oxide ($ZrO_2$). A portion of the vibrating plate 14 corresponding to the pressure chamber 15, that is, a portion which blocks a higher opening of the pressure chamber 15 (hollow portion) functions as a movable region (driving portion) which is displaced in a direction far from or getting closer to the nozzle 18, in association with bending deformation of the piezoelectric element 19. A communicating opening portion 23 which communicates with the reservoir 16 is opened at a portion of the vibrating plate 14 corresponding to the reservoir 16 of the flow path forming substrate 10.

The piezoelectric element 19 is formed at a portion in the insulating film 22 of the vibrating plate 14 corresponding to the pressure chamber 15. The piezoelectric element 19 in the embodiment is configured by stacking a lower electrode film 25 (first electrode), a piezoelectric film 26, and a higher electrode film 27 (second electrode) in order from the vibrating plate 14 side. According to the embodiment, the lower electrode film 25 and the piezoelectric film 26 are patterned in each pressure chamber 15, and the lower electrode film 25 is set to an individual electrode for each of the piezoelectric elements 19. In contrast to this, the higher electrode film 27 is set to an electrode common to each of the piezoelectric elements 19. That is, the higher electrode film 27 is continuously formed over each of the pressure chambers 15 along a pressure chamber aligning direction. In addition, a portion at which the higher electrode film 27, the piezoelectric film 26, and the lower electrode film 25 are overlapped in a stacking direction is a piezoelectric body active portion in which piezoelectric distortion occurs due to an application of a voltage to both of the electrode layers. That is, the higher electrode film 27 is set to a common electrode of the piezoelectric element 19, and the lower electrode film 25 is set to an individual electrode of the piezoelectric element 19. In addition, it is also possible to adopt a configuration in which the lower electrode film is set to a common electrode, and the higher electrode film is set to an individual electrode.

The lead electrode 20 formed of gold (Au) is formed on the higher electrode film 27 by interposing an adhesion layer which is not illustrated (for example, NiCr) therebetween. The lead electrodes 20 are patterned corresponding to each of the lower electrode films 25 as the individual electrode, and are electrically connected to the lower electrode films 25, respectively. In addition, a driving voltage (driving pulse) is selectively applied to each of the piezoelectric elements 19 through the lead electrode 20.

The piezoelectric film 26 in the embodiment is formed on the vibrating plate 14 so as to cover the lower electrode film 25. As the piezoelectric film 26, it is possible to use a material including lead (Pb), titanium (Ti), and zirconium (Zr), for example, a ferroelectric piezoelectric material such as lead zirconate titanate (PZT), a material obtained by adding metal oxide such as niobium oxide, nickel oxide, or magnesium oxide thereto, or the like.

The sealing plate 13 including an accommodating hollow portion 29 which can accommodate the piezoelectric element 19 is bonded to a top face of the actuator unit 12 on a side opposite to the lower face as a bonding face with the flow path forming substrate 10. The sealing plate 13 is a hollow box-shaped member in which the accommodating hollow portion 29 is open on the lower face side as a bonding face with the flow path forming substrate 10 on which the actuator unit 12 is stacked. The above described accommodating hollow portion 29 is a cavity formed from the lower face side of the sealing plate 13 to a middle position of the sealing plate 13 in the height direction toward the top face side. A liquid chamber hollow portion 30 is provided in the sealing plate 13 at a position isolated on the outer side in a direction orthogonal to the nozzle column, compared to the accommodating hollow portion 29, and in a region corresponding to the communicating opening portion 23 of the vibrating plate 14 and the reservoir 16 of the flow path forming substrate 10. The liquid chamber hollow portion 30 is provided along the aligning direction of the pressure chamber 15 by penetrating the sealing plate 13 in the thickness direction, and communicates with the communicating opening portion 23 and the reservoir 16 in series, as described above.

A compliance substrate 31 which is formed of a sealing film 32 and a fixing plate 33 is bonded onto the sealing plate 13. The sealing film 32 is formed of a material with low rigidity and flexibility (for example, polyphenylene sulfide film, thin stainless film, or the like), and one face of the liquid chamber hollow portion 30 is sealed with the sealing film 32. In addition, the fixing plate 33 is formed of a material which is thinner and harder than the sealing film 32 (for example, stainless steel, or the like). Since a region in the fixing plate 33 facing the reservoir is set to an opening portion 33a which penetrates in the thickness direction, one face of the reservoir is sealed only with the sealing film 32 with flexibility. In addition, in the sealing plate 13, a wiring opening portion 34 which penetrates the sealing plate 13 in the thickness direction is formed between the accommodating hollow portion 29 and the liquid chamber hollow portion 30. The other end of the lead electrode 20 of which one end is connected to the lower electrode film 25 of the piezoelectric element 19 in the accommodating hollow portion 29 is exposed into the wiring opening portion 34. A terminal of a wiring member such as a chip on film (COF) (not illustrated) from the printer main body side of the printer is electrically connected to the exposed portion of the lead electrode 20. The lower face of the sealing plate 13 is bonded to the top face of the flow path forming substrate 10 on which the actuator unit 12 is stacked, using an adhesive.

In the recording head 2 with the above described configuration, ink is taken into the reservoir 16 through the liquid chamber hollow portion 30, or the like, from the ink cartridges 3, and a flow path from the reservoir 16 to the nozzle 18 via the pressure chamber 15 is filled with ink. In addition, an electric field corresponding to a difference in potential between both of the electrodes between the respective lower electrode film 25 and the higher electrode film 27 which correspond to the pressure chamber 15 is applied due to a supply of a driving voltage from the printer main body side, and a pressure change occurs in ink in the pressure chamber 15 when operating faces of the piezoelectric element 19 and the vibrating plate 14 are deformed in a flexural manner. By controlling the pressure change, it is possible to cause ink to be ejected from the nozzle 18, or cause a meniscus in the nozzle 18 to perform a micro vibration to an extent of not ejecting ink.

Figure 6:
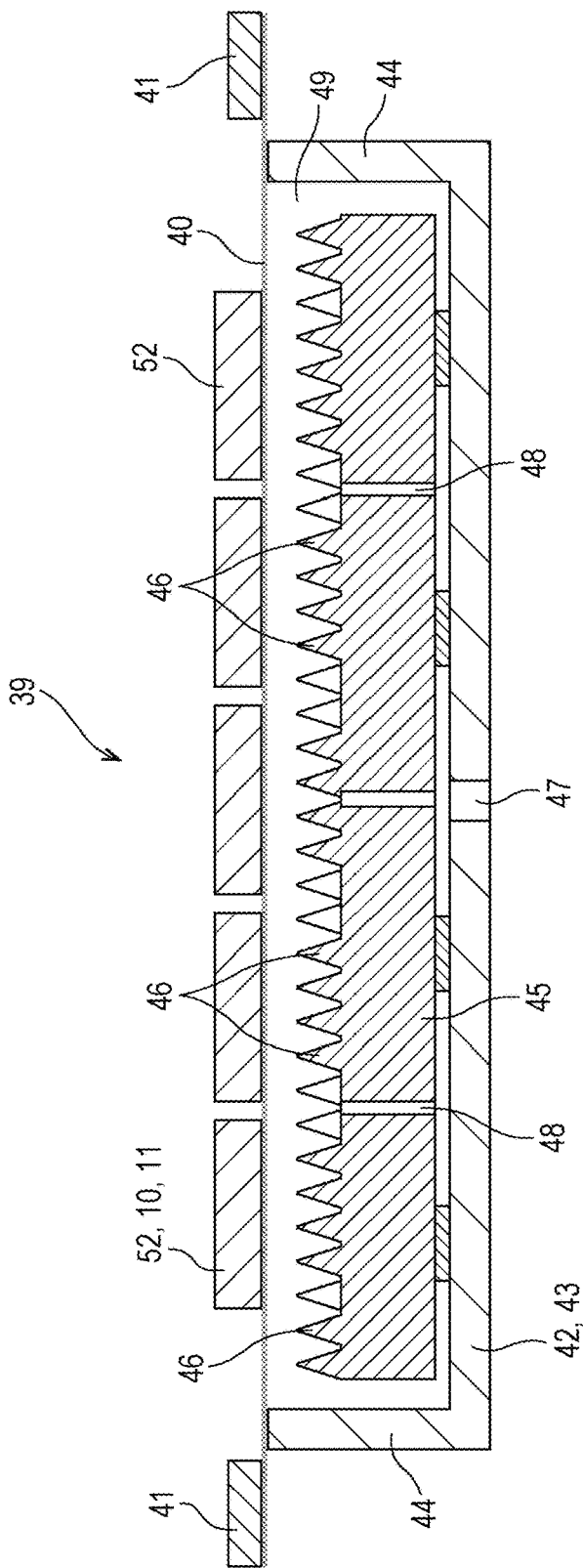
FIG. 6 is a sectional view which describes a configuration of a device for dividing and picking up a work which includes an adhesive tape separating tool according to the invention.

FIG. 6 is a sectional view which illustrates a configuration of the device for dividing and picking up the work 39 related to manufacturing of the recording head 2. The device for dividing and picking up the work 39 is a device which divides a bonded body of the above described silicon substrate 9 as the base material of the nozzle plate 11 and a silicon substrate (not illustrated) as a base material of the flow path forming substrate 10 into individual parts (stacked body of nozzle plate 11 and flow path forming substrate 10) as a work 52, and picks up the work. The device for dividing and picking up the work 39 in the embodiment is provided with a casing 42, and a separating tool 45 (a type of adhesive tape separating tool in invention) accommodated in the casing 42. The casing 42 is a cylindrical box with a base of which a top face (face on side opposite to base plate 43) is opened by a disk-shaped base plate 43 and a peripheral wall 44 which is erected from the outer peripheral edge of the base plate 43. The separating tool 45 is accommodated inside the casing 42. According to the embodiment, the separating tool 45 is disposed inside the casing 42 in a state in which a higher end of the separating tool 45 (apex portion of protrusion portion 46 which will be described later) is located on the slightly lower side (base plate 43 side) of a higher opening of the casing 42. A suctioning port 47 is open in the base plate 43 of the casing 42, and it is configured so that the inside of the casing 42 enters a negative pressure state using a suctioning mechanism such as a suctioning pump (not illustrated), through the suctioning port 47.

The dicing tape 40 with extensibility is bonded to one face of the work 52, which is one face on which the opening of the nozzle 18 of the silicon substrate 9 as the nozzle plate 11 is formed in the embodiment. The dicing tape 40 is a type of an adhesive tape in the invention, and is configured by stacking an adhesive layer formed of an acrylic adhesive member, for example, and a base member layer formed of a resin film such as polyethylene, polypropylene, for example. A ring-shaped frame 41 of which an inner diameter is set to be larger than the outer diameter of the casing 42 is attached to the peripheral edge portion of the dicing tape 40. The work 52 to which the dicing tape 40 is bonded is set to the casing 42 in a state in which a higher opening is blocked by the dicing tape 40 so that the entire work 52 is disposed in the higher opening of the casing 42 when viewed planarly. In this state, a portion in which the frame 41 is provided is located on the outer side in a plane direction of the higher opening of the casing 42. In addition, when the frame 41 descends downwardly (base plate 43 side) compared to a top face of the casing 42 using an expanding ring (not illustrated), the dicing tape 40 expands. Along with this, the work 52 is radially expanded from a center in the plane direction. As a result, the work 52 is cut along the predetermined lines for cutting L1, and L2, and is divided into individual parts (expanding brake) in the dicing tape 40. Hereinafter, the divided work 52 will be described.

Figure 7:
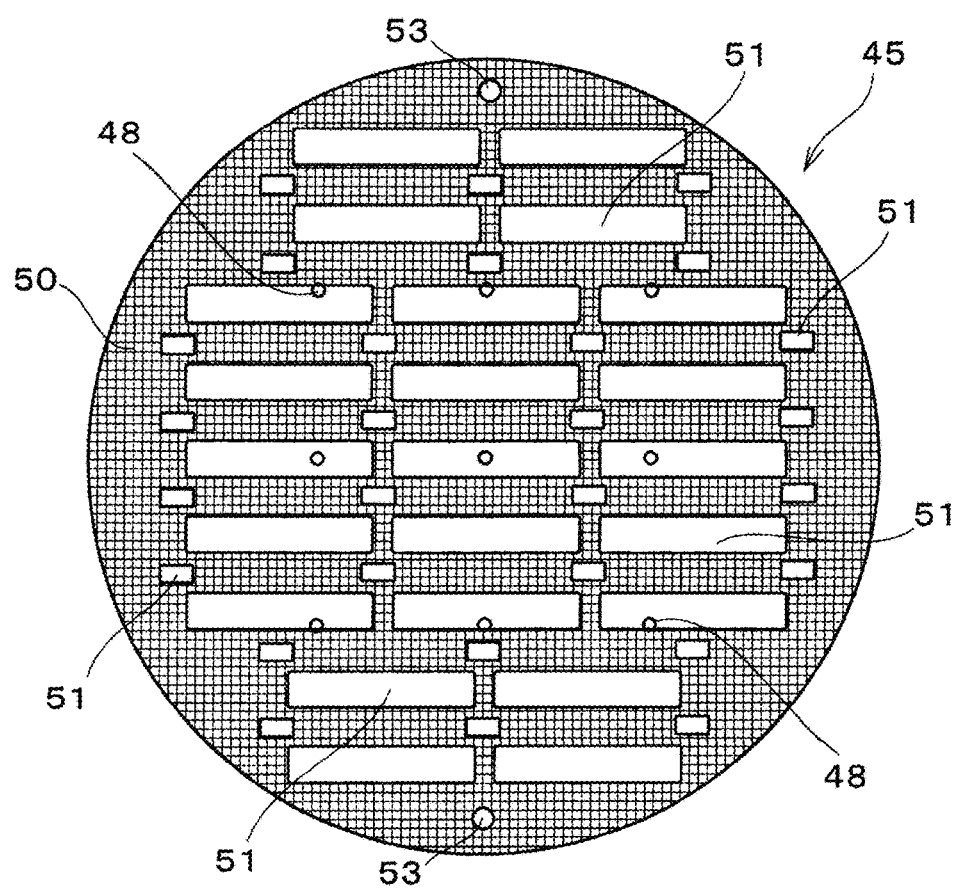
FIG. 7 is a plan view of the adhesive tape separating tool.
Figure 8:
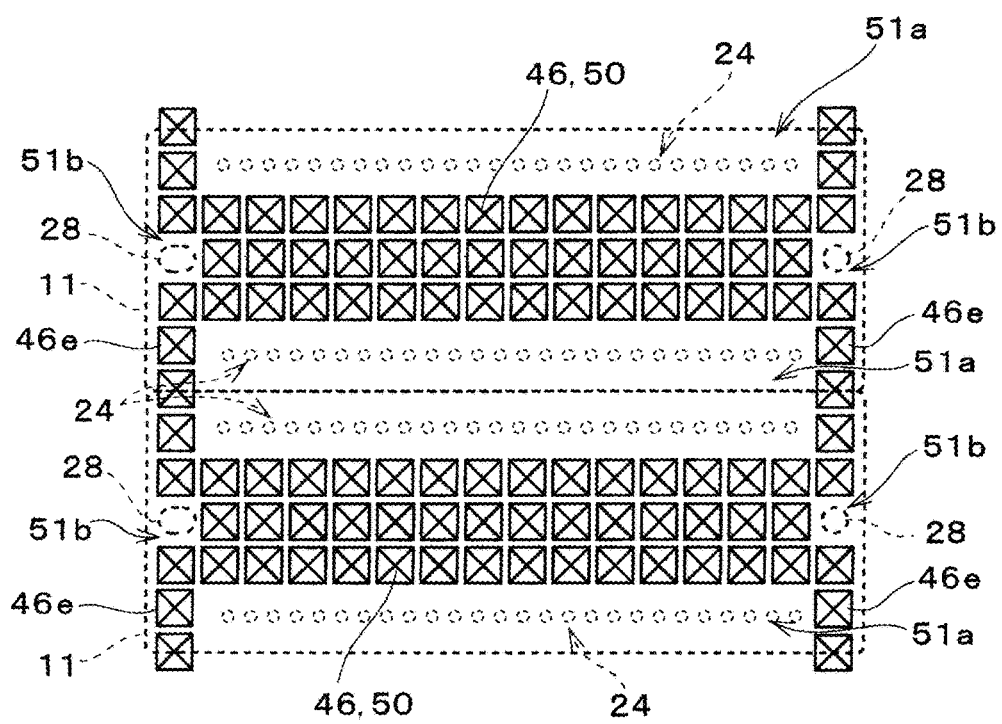
FIG. 8 is a diagram which illustrates a positional relationship between an opening of the work and a protrusion portion forming region.

FIG. 7 is a plan view which describes a configuration of the separating tool 45 in the invention. FIG. 8 is an enlarged view which illustrates a positional relationship between the nozzle column 24 of the nozzle plate 11 as the work 52 or the reference hole 28 and the protrusion portion 46. The separating tool 45 is a disk-shaped member with a size which can come into contact with the respective divided works 52. A protrusion portion forming region 50 in which the plurality of protrusion portions 46 are arranged is formed on a top face (face on work 52 side disposed in casing 42) on a top face of the separating tool 45. The protrusion portion 46 according to the embodiment is configured of a quadrangular pyramid-shaped protrusion which is formed so as to be tapered toward a tip end (apex portion) from the main body side (based end side) of the separating tool 45. In addition, the shape of the protrusion portion 46 is not limited to the example, and in short, it may be a shape which includes an apex portion which can come into contact with a face on one side to which the dicing tape 40 of the work 52 is bonded (hereinafter, referred to as abutting face) using a small contact area, such as a point contact or a line contact, and for example, it is also possible to adopt a conical shape, a needle shape, or the like. In addition, the size of the protrusion portion 46 may not be constant.

A removed portion 51 in which the protrusion portion 46 is not formed, partially, is provided on the top face of the separating tool 45. The removed portion 51 is provided at a portion corresponding to an opening formed on the abutting face of the work 52 on the top face of the separating tool 45, that is, according to the embodiment, a portion corresponding to the nozzle column 24 in the nozzle plate 11, or a portion corresponding to the reference hole 28. In other words, the protrusion portion forming region 50 is provided at a position separated from a position facing the opening of the abutting face of the work 52. For this reason, it is configured that the protrusion portion 46 does not come into contact with the nozzle column 24 or the reference hole 28, when the separating tool 45 comes into contact with the abutting face of the work 52 in order to separate the dicing tape 40. According to the embodiment, as described above, the protrusion portion 46 is not formed at the portion corresponding to the nozzle column 24, in the separating tool 45; however, one or more protrusion portions 46e are respectively disposed at positions corresponding to both sides (on extended line of nozzle column 24) in the nozzle aligning direction of the nozzle column 24. Here, for example, in a configuration in which the protrusion portion 46 is not provided on the extended line of the nozzle column 24, there is a case in which a posture of the work 52 is inclined, or the like, and is varied, since the separating tool 45 comes into contact with the work at only a center portion in a short direction of the abutting face of the work 52 (nozzle plate 11). As a result, there is a concern that lifting (picking up) of the work 52 using a pickup tool may become difficult. According to the embodiment, since one or more protrusion portions 46e are formed at positions corresponding to both sides in the nozzle aligning direction of the nozzle column 24, in the separating tool 45, it is possible to prevent a posture of the work 52 from being unstable. In this manner, it is possible to smoothly perform pickup of the work 52 which is divided.

A plurality of air holes 48 are formed in the separating tool 45 in a state of penetrating the thickness direction of the separating tool 45. According to the embodiment, nine air holes 48 in total are formed at a position corresponding to the removed portion 51, or a position between the protrusion portions 46 (valley portion) in the protrusion portion forming region 50. In addition, it is configured so that it is possible to depressurize a sealing space 49 which is formed by the casing 42 and the dicing tape 40 through the air holes 48, when performing suctioning through the suctioning port 47 of the casing 42. A forming position or the number of the air holes 48 is not limited to examples in the embodiment. In addition, two alignment marks 53 are formed at the outer peripheral edge portion on the top face of the separating tool 45. The alignment mark 53 is a mark as a reference of a position relative to the work 52, and is formed of a recessed portion, or the like, which is recessed partway from the top face to the lower face of the separating tool 45. These alignment marks 53 are disposed so as to align along a diameter direction which passes through a center of the separating tool 45.

In order to pick up or adsorb the work 52 divided by the dicing tape 40, using a pickup tool (collet), as described above, it is necessary to separate the dicing tape 40 from the work 52, prior to that. Hereinafter, a process of separating the dicing tape 40 from the work 52 will be mainly described.

Figure 9:
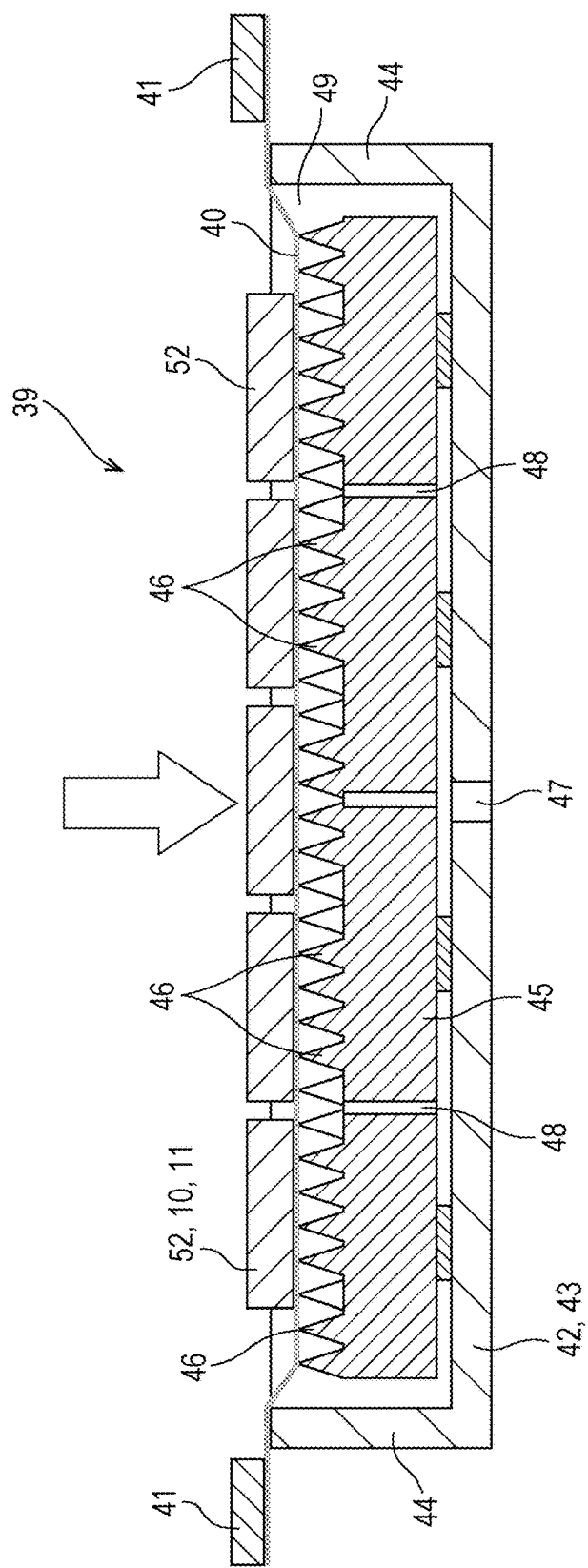
FIG. 9 is a process drawing which describes a process of separating adhesive tape from the work.

A relative position between the work 52 to which the dicing tape 40 is bonded to one face (abutting face) and the separating tool 45 disposed in the casing 42 in the plane direction is defined based on the above described alignment mark 53, for example (alignment process). In addition, as illustrated in FIG. 6, the work 52 to which the dicing tape 40 is bonded in a state in which the higher opening of the casing 42 is sealed with the dicing tape 40 is set to the casing 42. When suctioning is started through the suctioning port 47 of the casing 42 in this state, the sealing space 49 which is formed by the casing 42 and the dicing tape 40 through the air hole 48 is depressurized. When the sealing space 49 is depressurized, a difference in pressure occurs between the separating tool 45 side (sealing space 49 side) and the work 52 side (outside of casing 42) by setting the dicing tape 40 to a boundary. Due to the difference in pressure (suctioning force), as illustrated in FIG. 9, the dicing tape 40 is bent to the separating tool 45 side, the protrusion portion 46 of the separating tool 45 comes into contact with the abutting face of the work 52, and the abutting face of the work 52 and the apex portion of the protrusion portion 46 of the separating tool 45 are pressurized in a direction of getting closer to each other by interposing the dicing tape 40 therebetween (pressurizing process). However, as described above, in the separating tool 45, a position of the work 52 corresponding to the opening is set to the removed portion 51 in which the protrusion portion 46 is not formed, the protrusion portion 46 does not come into contact with the opening of the work 52, that is, the nozzle column 24 (nozzle 18) in the embodiment, or the opening of the reference hole 28. In other words, the protrusion portion 46 in the protrusion portion forming region 50 comes into contact with the work through the dicing tape 40 at a position separated from the opening in the work 52.

Figure 10:
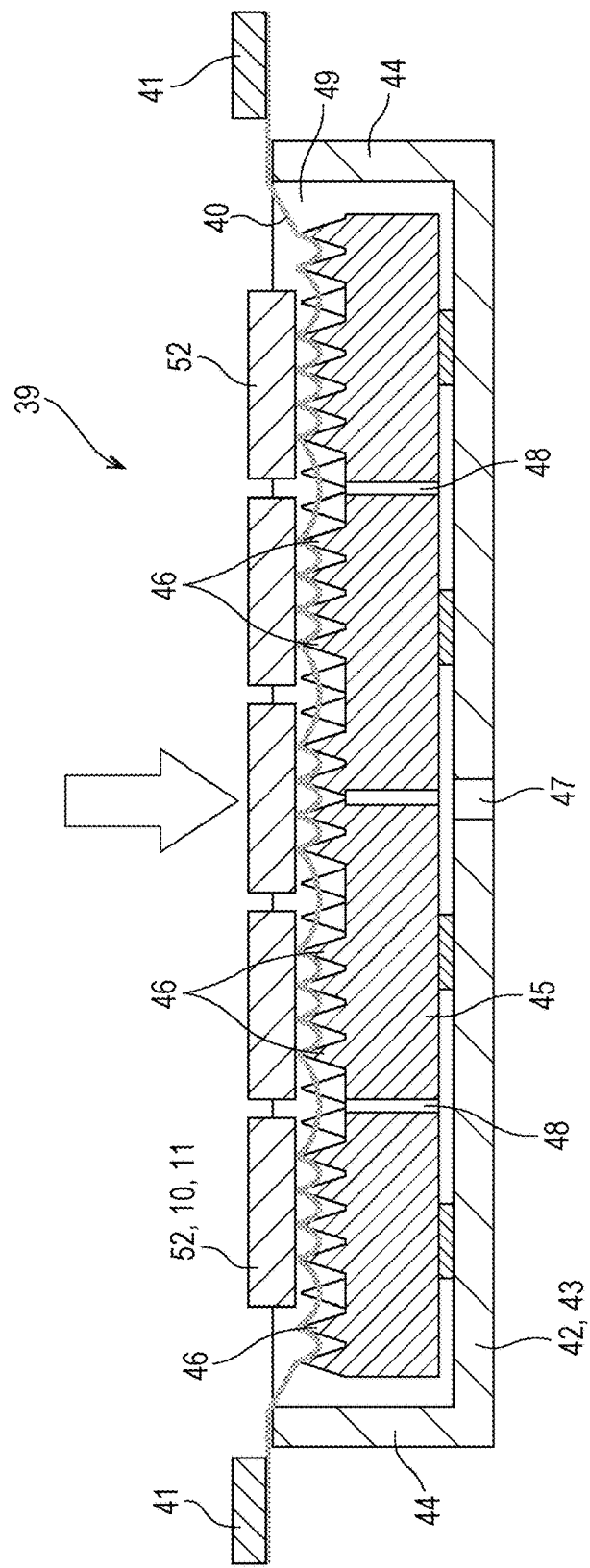
FIG. 10 is a process drawing which describes a process of separating the adhesive tape from the work.
Figure 11:
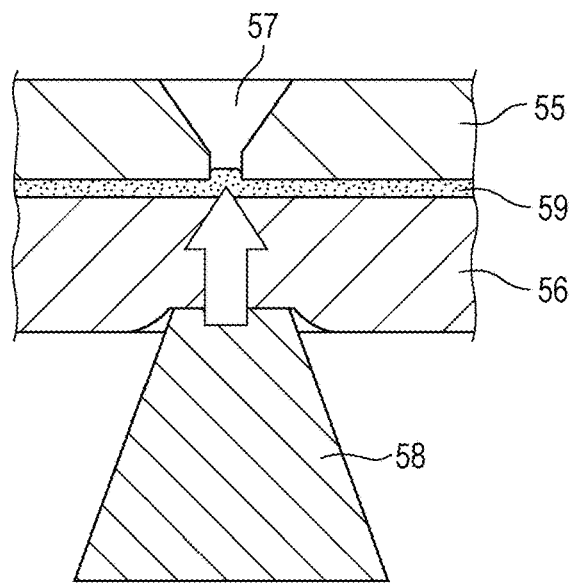
FIG. 11 is a process drawing which describes a process of separating adhesive tape from a work in the related art.
Figure 12:
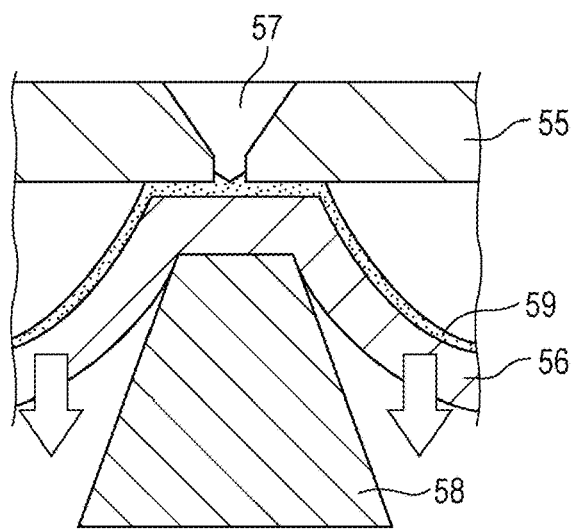
FIG. 12 is a process drawing which describes a process of separating the adhesive tape from the work in the related art.
Figure 13:
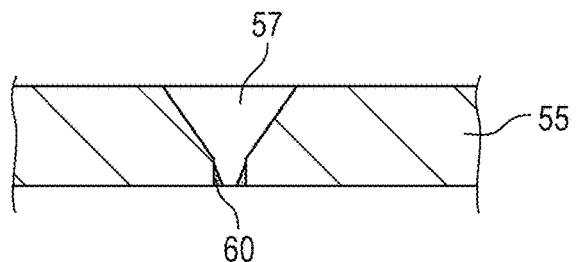
FIG. 13 is a process drawing which describes a process of separating the adhesive tape from the work in the related art.

When the sealing space 49 is further pressurized through the suctioning port 47 and the air hole 48, a pressure difference between the separating tool 45 side (sealing space 49 side) and the work 52 side (outside of casing 42) becomes larger. In this manner, as illustrated in FIG. 10, the dicing tape 40 at a portion other than the portion with which the apex portion of the protrusion portion 46 comes into contact, on the abutting face of the work 52 is separated from the abutting face of the work 52, and is bent to the separating tool 45 side at the valley portion between the protrusion portions 46 which are adjacent thereto, due to elasticity of the dicing tape 40. Since a contact area between the abutting face of the work 52 and the dicing tape 40 is remarkably reduced due to this, it is possible to smoothly pick up each work 52, by separating the work from the dicing tape 40, using the pickup tool (collet) from the side opposite to the abutting face of the work 52.

As described above, in the separating tool 45 according to the invention, the protrusion portion forming region 50 is provided at the position separated from the region corresponding to the opening of the work 52, and the region corresponding to the opening of the work 52 is set to the removed portion 51 in which the protrusion portion 46 is not formed. For this reason, even in a case in which the protrusion portion 46 of the separating tool 45 comes into contact with the abutting face of the work 52, and the both are pressurized in a direction of getting closer to each other, due to a difference in pressure which occurs between the separating tool 45 side (sealing space 49 side) and the work 52 side (outside of casing 42) by setting the dicing tape 40 to a boundary, when separating the dicing tape 40 from the work 52, the protrusion portion 46 does not come into contact with the opening of the work 52, that is, the nozzle column 24 (nozzle 18) or the reference hole 28 in the embodiment. In this manner, the adhesive member of the dicing tape 40 is prevented from entering and remaining in the opening of the work 52. As a result, the yield is improved. That is, in the recording head 2 according to the embodiment, since remaining of the adhesive member in the opening of the flow path, such as the nozzle 18, through which liquid flows, is prevented, it is possible to suppress a failure, for example, a situation in which flowing of liquid (ink) is hindered due to remaining of the adhesive member, bubbles are attached to the adhesive member, and remain, or the like. In addition, in the MEMS device which includes an opening related to an electrode, wiring, or the like, on a substrate, since it is possible to prevent a situation in which a part of the adhesive member of adhesive tape enters, and remains in an opening, an occurrence of a failure in electrical connection can be suppressed, for example.

Hitherto, one embodiment of the invention has been described; however, as a matter of course, the invention is not limited to such an embodiment. For example, a configuration of the piezoelectric element 19, or a configuration of the flow path formed in the flow path forming substrate 10 (pressure chamber 15, or the like) is not limited to the configuration exemplified in the embodiment, and it is also possible to adopt various configurations. In short, it is possible to apply the invention for use in separating adhesive tape from parts (works) which are divided, using expanding of the adhesive tape which is bonded to one face of a silicon substrate. That is, it is also possible to apply the invention in a case in which a semiconductor chip which is used in a semiconductor device is the work, for example. In this case, since it is possible to prevent the adhesive member of the adhesive tape from entering, and remaining in an opening of an electrode, wiring, or the like, of the semiconductor chip, an occurrence of failure in electrical connection can be suppressed.

In the above described embodiment, the configuration in which a difference in pressure between the separating tool 45 side and the work 52 side (outside of casing 42) is caused to occur, by depressurizing the separating tool 45 side (sealing space 49 side) by setting the dicing tape 40 to a boundary, when separating the dicing tape 40 from the work 52, has been exemplified; however, it is not limited to this, and it is also possible to adopt a configuration in which a difference in pressure between the separating tool 45 side and the work 52 side is caused to occur, by forming a sealing space on the work 52 side, by setting the dicing tape 40 to a boundary, and pressurizing the sealing space, and the protrusion portion 46 of the separating tool 45 comes into contact with the abutting face of the work 52 due to the difference in pressure, and the both are pressurized in a direction of getting closer to each other.

In the above described embodiment, as one form of the MEMS device which includes the stacked body manufactured as described above, a liquid ejecting head, or an ink jet recording head mounted on an ink jet printer has been exemplified; however, it is also possible to apply the invention to an apparatus which ejects liquid other than ink. For example, it is also possible to apply the invention to a coloring material ejecting head which is used when manufacturing a color filter of a liquid ejecting apparatus, and the like, an electrode material ejecting head which is used when forming an electrode of an organic electroluminescence (EL) display, a surface emission display (FED), and the like, and a MEMS device such as a bioorganic material ejecting head which is used when manufacturing a biochip (biochemical element).

The entire disclosure of Japanese Patent Application No. 2016-186715, filed Sep. 26, 2016 is expressly incorporated by reference herein.

What is claimed is:

1. An adhesive tape separating tool which separates adhesive tape bonded to one face of a work including an opening on the one face, from the work,
wherein a protrusion portion forming region in which a plurality of protrusion portions are formed is provided on a face on a side which comes into contact with the work in the tape separating tool, and
another region where the plurality of protrusion portions are not formed and that faces the opening on the one face of the work;
wherein the protrusion portion forming region is disposed at a position separated from the another region,
wherein when a negative pressure is applied to the adhesive tape separating tool, the adhesive tape is caused to sag in the another region such that in that region the adhesive tape does not contact the adhesive tape separating tool.

2. The adhesive tape separating tool according to claim 1, wherein an opening group in which a plurality of the openings are aligned in a first direction is formed on one face of the work, and
wherein the adhesive tape separating tool includes a protrusion portion at each of positions corresponding to both sides of the opening group in the first direction.

3. A manufacturing apparatus of a semiconductor chip in which adhesive tape bonded to one face of a semiconductor chip, as a work including an opening on one face is separated from the semiconductor chip, the apparatus comprising:
the adhesive tape separating tool according to claim 1.

4. A manufacturing apparatus of a semiconductor chip in which adhesive tape bonded to one face of a semiconductor chip, as a work including an opening on one face is separated from the semiconductor chip, the apparatus comprising:
the adhesive tape separating tool according to claim 2.

5. A manufacturing apparatus of a MEMS device in which adhesive tape bonded to one face in one substrate included in the MEMS device, on which an opening is formed is separated from the substrate, the apparatus comprising:
the adhesive tape separating tool according to claim 1.

6. A manufacturing apparatus of a MEMS device in which adhesive tape bonded to one face in one substrate included in the MEMS device, on which an opening is formed is separated from the substrate, the apparatus comprising:
the adhesive tape separating tool according to claim 2.

7. A manufacturing apparatus of a liquid ejecting head in which adhesive tape bonded to one face in one substrate included in the liquid ejecting head, on which an opening is formed is separated from the substrate, the apparatus comprising:
the adhesive tape separating tool according to claim 1.

8. A manufacturing apparatus of a liquid ejecting head in which adhesive tape bonded to one face in one substrate included in the liquid ejecting head, on which an opening is formed is separated from the substrate, the apparatus comprising:
the adhesive tape separating tool according to claim 2.

* * * * *